United States Patent
Lasser et al.

(10) Patent No.: US 6,903,972 B2
(45) Date of Patent: Jun. 7, 2005

(54) DIFFERENT METHODS APPLIED FOR ARCHIVING DATA ACCORDING TO THEIR DESIRED LIFETIME

(75) Inventors: Menahem Lasser, Kohav Yair (IL); Amir Ronen, Hod Hasharon (IL)

(73) Assignee: M-Systems Flash Disk Pioneers Ltd., Kfar Saba (IL)

(*) Notice: Subject to any disclaimer, the term of this patent is extended or adjusted under 35 U.S.C. 154(b) by 0 days.

(21) Appl. No.: 10/735,667

(22) Filed: Dec. 16, 2003

(65) Prior Publication Data

US 2005/0024941 A1 Feb. 3, 2005

Related U.S. Application Data

(60) Provisional application No. 60/492,206, filed on Jul. 30, 2003.

(51) Int. Cl.$^7$ ............................................. G11C 16/04
(52) U.S. Cl. ......................... 365/185.18; 365/185.19; 365/185.24; 711/136; 711/156; 711/160
(58) Field of Search ................. 711/136, 156, 711/160; 365/185.18, 185.19, 185.24

(56) References Cited

U.S. PATENT DOCUMENTS

| | | | |
|---|---|---|---|
| 5,930,167 A | 7/1999 | Lee et al. | |
| 6,070,228 A * | 5/2000 | Belknap et al. | 711/118 |
| 6,212,568 B1 * | 4/2001 | Miller et al. | 709/236 |
| 6,456,528 B1 | 9/2002 | Chen | |
| 6,542,966 B1 * | 4/2003 | Crawford et al. | 711/133 |
| 2002/0092030 A1 * | 7/2002 | Gu | 725/134 |

* cited by examiner

Primary Examiner—Van Thu Nguyen
(74) Attorney, Agent, or Firm—Mark M. Friedman

(57) ABSTRACT

A method and system for archiving data. The data are classified according to their desired lifetime and then archived in a memory using a storage method whose reliability is in accordance with the desired lifetime. For example, when storing data in the cells of an EPROM, short-term data could be archived using larger programming voltage pulse increments than for long-term data, using a lower target threshold voltage than for long-term data, using wider programming voltage pulses than for long-term data, using higher starting programming voltages than for long-term data, using fewer programming voltage pulses than for long term data, using lower maximum programming voltages than for long term data, or using more levels per cell than for long-term data.

10 Claims, 4 Drawing Sheets

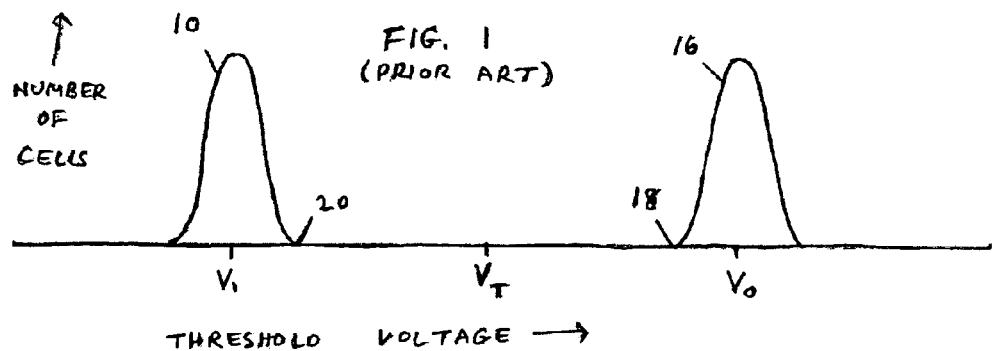
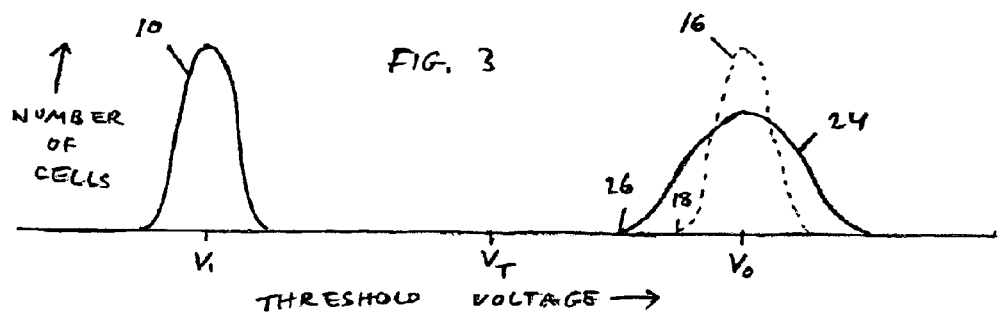
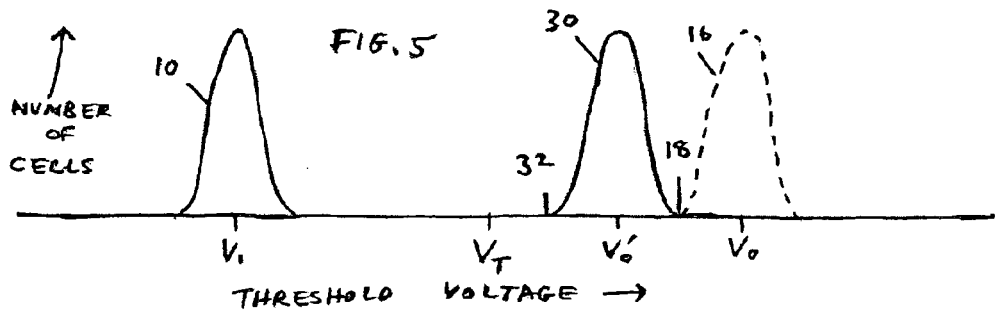
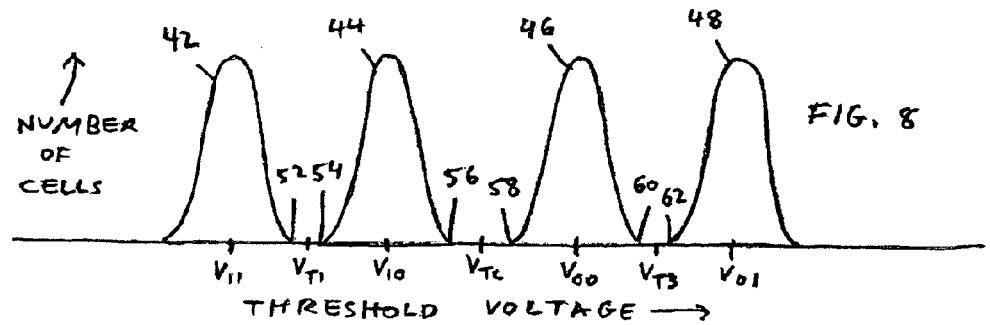

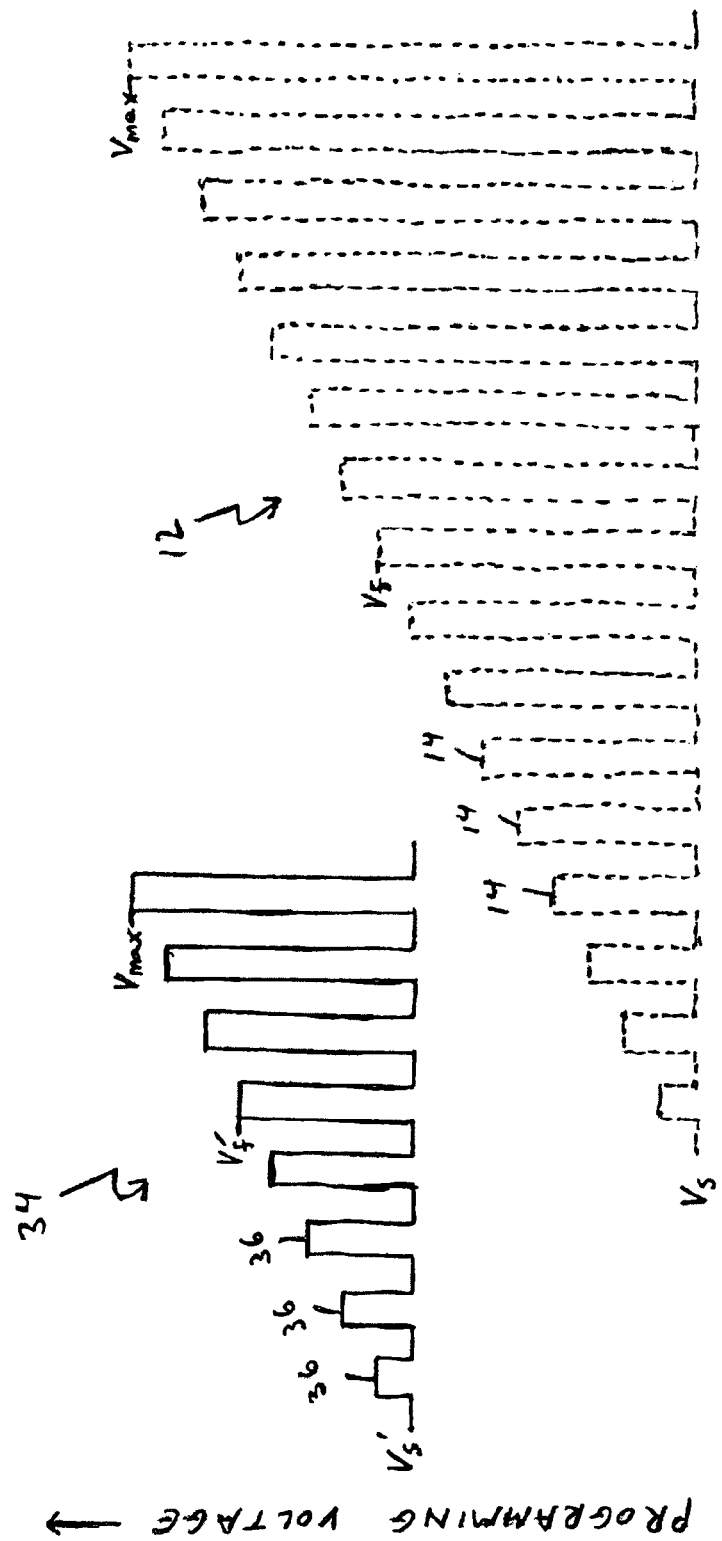

US 6,903,972 B2

DIFFERENT METHODS APPLIED FOR ARCHIVING DATA ACCORDING TO THEIR DESIRED LIFETIME

This is a continuation-in-part of U.S. Provisional Patent Application Ser. No. 60/492,206, filed Jul. 30, 2003.

FIELD AND BACKGROUND OF THE INVENTION

The present invention relates to data storage and, more particularly, to a method of archiving data in accordance with an expected lifetime of the data.

FIGS. 1 and 2 illustrates the storage of a bit, either a zero bit or a one bit, in a cell of an electronically programmable memory (EPROM) such as a flash memory. For historical reasons, this process of storing data in a EPROM is called "programming" the EPROM. Nominally, a zero bit is represented by a cell threshold voltage $V_0$ and a one bit is represented by a cell threshold voltage $V_1$. Initially, the cell has a nominal threshold voltage $V_1$. For example, after a block of a flash memory has been erased, all the cells have nominal threshold voltages $V_1$. Because of unavoidable inaccuracies in the initializations of the cells, the actual threshold voltages are distributed around the nominal threshold voltage $V_1$ according to a distribution curve 10. Then, to each cell that is to store a zero bit, a train 12 of programming voltage pulses 14 is applied, in order to inject electrons from the cell's silicon substrate through the cell's oxide layer into the cell's floating gate. Because the electrons move through the oxide layer by quantum mechanical tunneling or by hot injection, and because of non-uniformities in the cells' structures, the voltage required to inject enough electrons to increase the threshold voltage from $V_1$ to $V_0$ cannot be predicted accurately in advance. The voltage of the first pulse 14 is a starting voltage $V_s$+a programming voltage increment $\Delta V$. Every subsequent pulse 14 is higher than its predecessor by $\Delta V$. After each pulse 14 is applied, the cell is tested to see if its threshold voltage is sufficiently close to $V_0$. If the threshold voltage is sufficiently close to $V_0$ then the programming of cell is complete. Otherwise, the next pulse 14 is applied to the cell and the threshold voltage of the cell again is tested. Because the initial threshold voltages are distributed about the nominal voltage $V_1$, and because of inaccuracies in the programming, the threshold voltages of the cells that store zero bits also are distributed about the nominal threshold voltage $V_0$, according to a distribution curve 16.

Data are read from the EPROM cells by sensing the cells' threshold voltages. A threshold voltage greater than a transition threshold voltage $V_T$ halfway between $V_0$ and $V_1$ is interpreted as a zero bit. A threshold voltage less than $V_T$ is interpreted as a one bit. Over time, primarily because of the tunneling of electrons from the floating gates back to the substrate, the distributions 10 and 16 tend to become broader. The difference between threshold voltages $V_0$ and $V_1$ is selected to be great enough so that, over the lifetime of the EPROM, the likelihoods that the lower end 18 of distribution 16 will descend below $V_T$ and that the upper end 20 of distribution 10 will ascend above $V_T$ are negligible.

SUMMARY OF THE INVENTION

As noted above, an EPROM cell is programmed by applying successive voltage pulses 14 to the cell and testing the cell after each pulse 14 to see if the cell's threshold voltage is sufficiently close to the desired nominal threshold voltage $V_0$. This is a relatively lengthy process. A zero bit that is part of a dataset that needs to reside in the EPROM for much less than the full lifetime of the EPROM (e.g. months instead of decades) could be programmed by setting the threshold voltage of a cell to less than $V_0$, using fewer voltage pulses 14, in a shorter programming time, but with no impact on effective reliability because the voltages so programmed nevertheless would be almost certain not to drift below $V_T$ for the useable lifetime of the dataset.

Therefore, according to the present invention there is provided a method of archiving data in a memory, including the steps of: (a) classifying the data according to a desired lifetime thereof; and (b) archiving the data in the memory using a storage method having a reliability in accordance with the desired lifetime.

Furthermore, according to the present invention there is provided a system for archiving data, including: (a) a mechanism for classifying the data according to a desired lifetime thereof; and (b) a memory having a controller operative to archive the data in the memory using a storage method having a reliability in accordance with the desired lifetime.

The present invention is a method and system for archiving data. "Archiving" is understood herein to mean storage of data in a memory device in which the data are intended to reside and be retrievable for a relatively long time. So, for example, the caching of frequently accessed data and code in a cache memory during the execution of the code is specifically excluded from the scope of the term "archiving" as understood herein. Similarly, temporary storage of data in a memory device, with the intention of copying the data to a different memory device or (subject to the caveats below) to a different location in the same memory device, is specifically excluded from the scope of the term "archiving" as understood herein. For example, Lee et al., in U.S. Pat. No. 5,930,167, teach temporary storage of data in two-level flash cells, pending the transfer of the data to multi-level flash cells for long-term storage. The temporary storage of the data in the two-level cells does not fall within the scope of the term "archiving" as understood herein, whereas the subsequent storage of the data in the multi-level cells may fall within the scope of the term "archiving" as understood herein.

Being "retrievable" means that the addresses at which the data are stored and by which the data are referenced from outside the memory device remain stable over the desired lifetime of the data. In the case of a flash memory device whose data are referenced from outside the device via logical addresses that are different from the physical addresses at which the data actually reside, the relevant addresses for defining "retrievable" are the logical addresses. Therefore, data that are stored in a certain physical location in a flash memory device and that then are copied to a different location in the flash memory device, so that the first location can be erased and recycled for housekeeping purposes such as wear leveling, may be considered to be "archived" in the flash memory device as the term "archived" is understood herein, because typically the logical addresses of those data are preserved by such a procedure even though the physical location of the data changes. Because the data are recognized from outside the flash memory device by their logical addresses, not by their physical addresses, the data are considered herein to effectively always be in the same location for retrieval even though the physical location of the data in the flash memory device changes.

Furthermore, some operations that are commonly called "caching" are considered herein to be instances of "archiving". For example, a Web browser often "caches" some of the pages that it has found on the Internet and that are stable over time. If a user of the Web browser, while surfing the Internet, attempts to access a page that the Web browser recognizes as having been "cached", the Web browser retrieves the page from the cache rather than downloading the page from the Internet. Typically, such pages are saved for a length of time, such as a week or a month, that is much longer than a typical Web surfing session but is much shorter than the lifetime of the memory device in which the Web browser stores the pages. Such storage is considered herein to be "archiving". Indeed, such storage is an important application of the present invention.

According to the method of the present invention, first the data are classified according to the desired lifetime of the data. The "desired lifetime" of the data is the amount of time that the data should be accurately retrievable from the data storage medium, or memory, in which they are stored. Then the data are stored in that data storage medium using a storage method whose reliability is in accordance with the desired lifetime of the data. The "reliability" of a storage method is the length of time that data stored using the method can be retrieved from storage without significant errors. Data with a relatively long desired lifetime are stored using a relatively more reliable method. Data with a relatively short desired lifetime are stored using a relatively less reliable method.

A system of the present invention includes a mechanism for classifying the data according to the data's desired lifetime and a memory that has a controller that archives the data in the memory using a storage method whose reliability is in accordance with the desired lifetime of the data.

Examples of suitable mechanisms include a processor that runs an application that produces and classifies the data, and an input device with which a user classifies the data.

Preferably, the memory is non-volatile.

Preferably, in both the method of the present invention and the system of the present invention, the reliability of the storage method is adjustable, and is controlled by a parameter whose value is set, in accordance with how the data were classified, to achieve the desired reliability. Examples of such parameters in the context of storage in the cells of an EPROM include the programming voltage pulse increment used, the target threshold voltage, the programming voltage pulse widths used, the starting programming voltage and the number of levels per cell.

BRIEF DESCRIPTION OF THE DRAWINGS

The invention is herein described, by way of example only, with reference to the accompanying drawings, wherein:

FIG. 1 shows the distribution of threshold voltages of a two-level EPROM cell according to the prior art;

FIG. 3 shows the distribution of threshold voltages of a two-level EPROM cell programmed using a larger programming voltage increment, wider programming pulses than in the prior art or a higher starting programming voltage than in the prior art;

FIGS. 4, 6 and 7 show programming pulse trains used to program the upper threshold voltage of FIG. 3;

FIG. 5 shows the distribution of threshold voltages of a two-level EPROM cell programmed using a lower threshold voltage to represent a zero bit than in the prior art;

FIG. 8 shows the distribution of threshold voltages of a four-level EPROM cell used for short-term archiving of data;

DESCRIPTION OF THE PREFERRED EMBODIMENTS

The present invention is of a method and system for archiving data. Specifically, the present invention can be used to trade off storage reliability against storage speed, depending on the desired lifetime of the data.

The principles and operation of data archiving according to the present invention may be better understood with reference to the drawings and the accompanying description.

Figure 4:
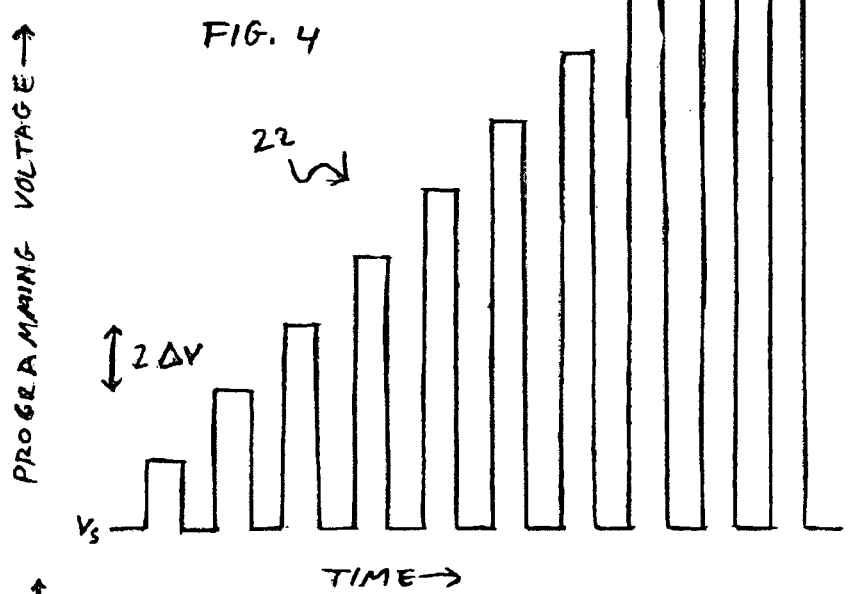

Returning now to the drawings, FIGS. 3 and 4 illustrate the programming of a zero bit in a cell of an EPROM according to a first embodiment of the present invention, in which the storage method parameter is the programming voltage increment. A train 22 of programming voltage pulses with a programming voltage increment twice as large as the programming voltage increment $\Delta V$ of FIG. 1 is applied to the cell until the threshold voltage of the cell is sufficiently close to $V_0$. The cell of FIGS. 3 and 4 is programmed in less time than the cell of FIGS. 1 and 2, at the expense of the distribution 24 of the resulting threshold voltages around $V_0$ being wider than distribution 16, which is shown in FIG. 3 in phantom for reference. It follows that the lower end 26 of distribution 24 drifts down to $V_T$ sooner than lower end 18 of distribution 16; but if it takes much longer than e.g. one month for lower end 26 to drift down to $V_T$, this embodiment of the present invention is suitable for storing data, such as "cached" Web pages, that need to be archived for only one month. Data that need to be archived for many years are programmed as illustrated in FIGS. 1 and 2.

Figure 2:
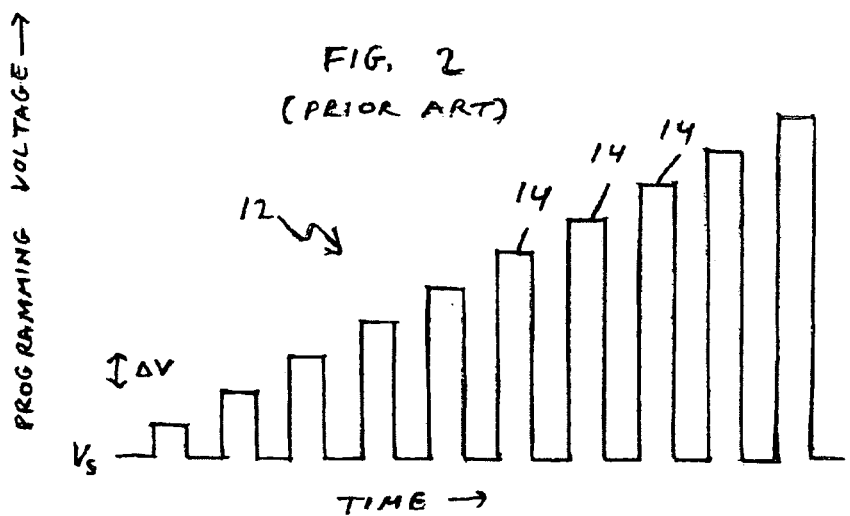
FIG. 2 shows the programming pulse train of an EPROM cell according to the prior art.

FIGS. 2 and 5 illustrate the programming of a zero bit in a cell of an EPROM according to a second embodiment of the present invention, in which the storage method parameter is the target threshold voltage. Programming voltage pulse train 12 of FIG. 2 is applied to the cell, as in the prior art, but only until the threshold voltage reaches a target value that is sufficiently close to a voltage $V_0'$ that is less than $V_0$. Because $V_0'$ is less than $V_0$, the cell of FIG. 5 is programmed in less time than the cell of FIGS. 1 and 2, at the expense of the distribution 30 of the resulting floating gate voltages being closer to $V_T$ than distribution 16, which is shown in FIG. 5 in phantom for reference. It follows that the lower end 32 of distribution 30 drifts down to $V_T$ sooner than lower end 18 of distribution 16; but if it takes much longer than e.g. one month for lower end 32 to drift down to $V_T$, this embodiment of the present invention is suitable for storing data, such as "cached" Web pages, that need to be archived for only one month. Data that need to be archived for many years are programmed as illustrated in FIG. 1.

Figure 6:
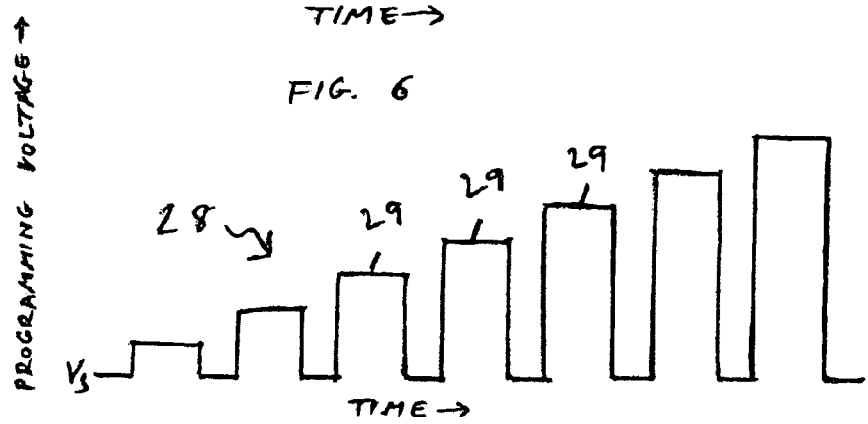

FIGS. 3 and 6 illustrate the programming of a zero bit in a cell of an EPROM according to a third embodiment of the present invention, in which the storage method parameter is the width of the programming pulses. A train 28 of programming pulses 29 having twice the width of pulses 14 but the same programming voltage increment $\Delta V$ is applied to the cell, until the threshold voltage of the cell is sufficiently close to $V_0$. As in the first embodiment of the present invention, the cell of FIG. 6 is programmed in less time than the cell of FIGS. 1 and 2, at the expense of distribution 24 of the resulting threshold voltages around $V_0$ being wider than distribution 16. As in the first embodiment of the present invention, lower end 26 of distribution 24 drifts down to $V_T$ sooner than lower end 18 of distribution 16; but if it takes much longer than e.g. one month for lower end 26 to drift down to $V_T$, this embodiment of the present invention is suitable for storing data, such as "cached" Web pages, that need to be archived for only one month. Data that need to be archived for many years are programmed as illustrated in FIGS. 1 and 2.

FIGS. 3 and 7 illustrate the programming of a zero bit in a cell of an EPROM according to a fourth embodiment of the present invention, in which the storage method parameter is the starting programming voltage. A train 34, of programming pulses 36, that has a higher starting voltage $V_s'$ than the starting voltage $V_s$ of programming voltage pulse train 12 but the same programming voltage increment $\Delta V$ is applied to the cell, until the threshold voltage of the cell is sufficiently close to $V_0$. For reference, programming voltage pulse train 12 also is shown in FIG. 7 in phantom. As in the first three embodiments of the present invention, the cell of FIG. 7 is programmed in less time than the cell of FIGS. 1 and 2, because starting from a higher starting voltage makes it likely that the desired threshold voltage will be reached after fewer pulses 36 of programming voltage pulse train 34 than pulses 14 of programming voltage pulse train 12. In the illustrated example, nine pulses 14 of programming voltage pulse train 12 are needed to reach the final programming voltage pulse height $V_f$ that achieves the desired threshold voltage starting from starting voltage $V_s$, but only five pulses 36 of programming voltage pulse train 34 are needed to reach the final programming voltage pulse height $V_f'$ that achieves the desired threshold voltage starting from starting voltage $V_s'$. (Note that because of the stochastic nature of the programming process $V_f'$ is not necessarily equal to $V_f$: usually, as illustrated, $V_f'$ is greater than $V_f$, but fewer pulses 36 than pulses 14 nevertheless are needed to achieve the desired threshold voltage because programming voltage pulse train 34 starts from a higher starting voltage than programming voltage pulse train 12.) As in the first and third embodiments of the present invention, this speed is achieved at the expense of distribution 24 of the resulting threshold voltages around $V_0$ being wider than distribution 16. Also as in the first and third embodiments of the present invention, lower end 26 of distribution 24 drifts down to $V_T$ sooner than lower end 18 of distribution 16; but if it takes much longer than e.g. one month for lower end 26 to drift down to $V_T$, this embodiment of the present invention is suitable for storing data, such as "cached" Web pages, that need to be archived for only one month. Data that need to be archived for many years are programmed as illustrated in FIGS. 1 and 2.

FIGS. 3 and 7 also illustrate the programming of a zero bit in a cell of an EPROM according to a fifth embodiment of the present invention, in which the storage method parameter is the maximum allowed number of programming voltage pulses. According to the prior art, pulses 14 of programming voltage pulse train 12 are applied to the cell only until the programming voltage pulse height reaches a preselected maximum $V_{max}$. If the desired threshold voltage is not achieved, even using a programming voltage pulse 14 whose height is $V_{max}$, the cell is deemed defective. Programming voltage pulse train 12 reaches $V_{max}$ after sixteen pulses 14. Programming voltage pulse train 34 reaches $V_{max}$ after only eight pulses 36.

In a sixth embodiment of the present invention, the storage method parameter is the maximum programming voltage. Programming voltage pulse train 12 is used, but up to a maximum programming voltage pulse height of $V_{max}'$ that is lower than $V_{max}$. This saves time, at the expense of a higher probability that the cell will be deemed defective.

FIG. 8 illustrates the programming of a zero bit in a cell of an EPROM according to a seventh embodiment of the present invention, in which the storage method parameter is the number of voltage levels used to encode bits in each cell. Specifically, FIG. 8 illustrates the programming of two bits per cell. The bit pair (1,1) is represented by a threshold voltage $V_{11}$. The bit pair (1,0) is represented by a threshold voltage $V_{10}$. The bit pair (0,0) is represented by a threshold voltage $V_{00}$. The bit pair (0,1) is represented by a threshold voltage $V_{01}$. Initially, the cell has a nominal threshold voltage $V_{11}$. As in a two-level cell, the cells' actual initial threshold voltages are distributed around the nominal voltage $V_{11}$, according to a distribution curve 42. Then, to each cell that is to store a bit pair other than (1,1), train 12 of programming voltage pulses 14 is applied. To store the bit pair (1,0) in the cell, pulses 14 are applied to the cell until the cell's threshold voltage is sufficiently close to $V_{10}$. To store the bit pair (0,0) in the cell, pulses 14 are applied to the cell until the cell's threshold voltage is sufficiently close to $V_{00}$. To store the bit pair (0,1) in the cell, pulses 14 are applied to the cell until the cell's threshold voltage is sufficiently close to $V_{01}$. Because the initial voltages on the floating gates are distributed about the nominal voltage $V_{11}$, and because of inaccuracies in the programming, the threshold voltages that represent the bit pair (1,0) are distributed about the nominal voltage $V_{10}$ according to a distribution curve 44, the threshold voltages that represent the bit pair (0,0) are distributed about the nominal voltage $V_{00}$ according to a distribution curve 46 and the threshold voltages that represent the bit pair (0,1) are distributed about the nominal voltage $V_{01}$ according to a distribution curve 48.

When such a four-level cell is read, a threshold voltage less than a transition voltage $V_{T1}$ halfway between $V_{10}$ and $V_{11}$ is interpreted as the bit pair (1,1), a threshold voltage greater than $V_{T1}$ but less than a transition voltage $V_{T2}$ halfway between $V_{00}$ and $V_{10}$ is interpreted as the bit pair (1,0), a threshold voltage greater than $V_{T2}$ but less than a transition voltage $V_{T3}$ halfway between $V_{01}$ and $V_{00}$ is interpreted as the bit pair (0,0), and a threshold voltage greater than $V_{T3}$ is interpreted as the bit pair (0,1). In this example, $V_{11}=V_1$ of FIG. 1, $V_{T2}=V_T$ of FIG. 1 and $V_{01}=V_2$ of FIG. 1, so that as distributions 42, 44, 46 and 48 become broader over time, eventually the upper end 52 of distribution 42 drifts above $V_{T1}$, the lower end 54 of distribution 44 drifts below $V_{T1}$, the upper end 56 of distribution 44 drifts above $V_{T2}$, the lower end 58 of distribution 46 drifts below $V_{T2}$, the upper end 60 of distribution 46 drifts above $V_{T3}$ and the lower end 62 of distribution 48 drifts below $V_{T3}$. The bit pair values then read from cells programmed as illustrated in FIG. 8 are unreliable. But typically this drift, while faster than the total life of the EPROM, is slow enough to allow data to be archived for weeks or months. Therefore, according to the seventh embodiment of the present invention, data to be archived for a relatively short time are archived as illustrated in FIG. 8, and data to be archived for a relatively long time are archived as illustrated in FIGS. 1 and 2.

Chen et al., in U.S. Pat. No. 6,456,528, also teach alternate storage of data in two-level cells and multi-level cells. However, Chen et al. advocate storing data that are rewritten or refreshed frequently in two-level cells while storing more permanent data in multi-level cells because of the longer time needed to write to multi-level cells than to two-level cells. This is the opposite of what is advocated in the seventh embodiment of the present invention.

Figure 9:
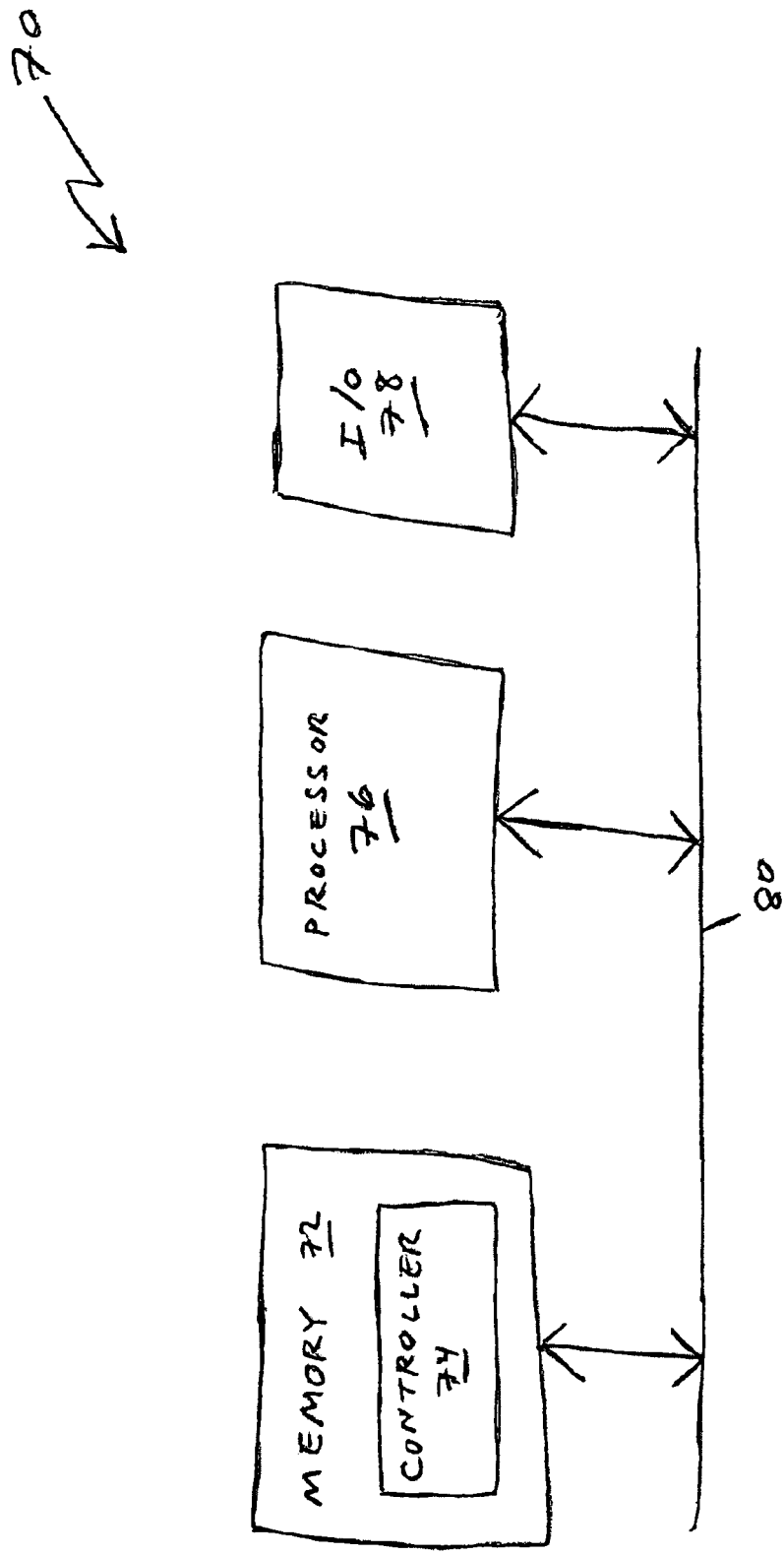
FIG. 9 is a partial high-level block diagram of a system of the present invention.
Figure 2:
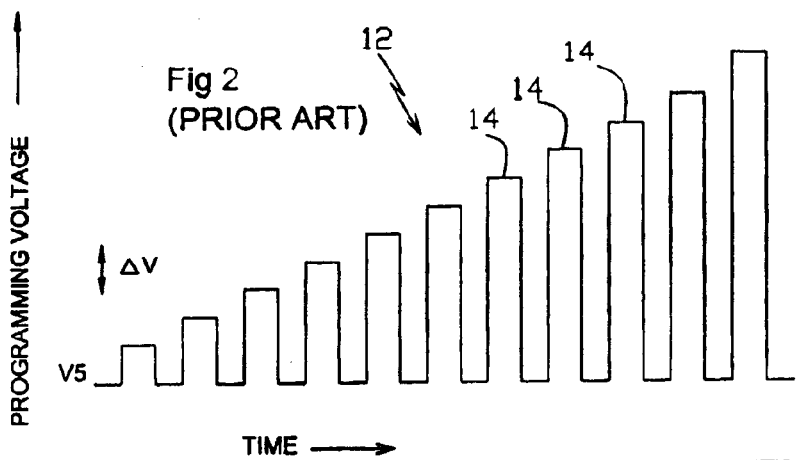
Figure 4:
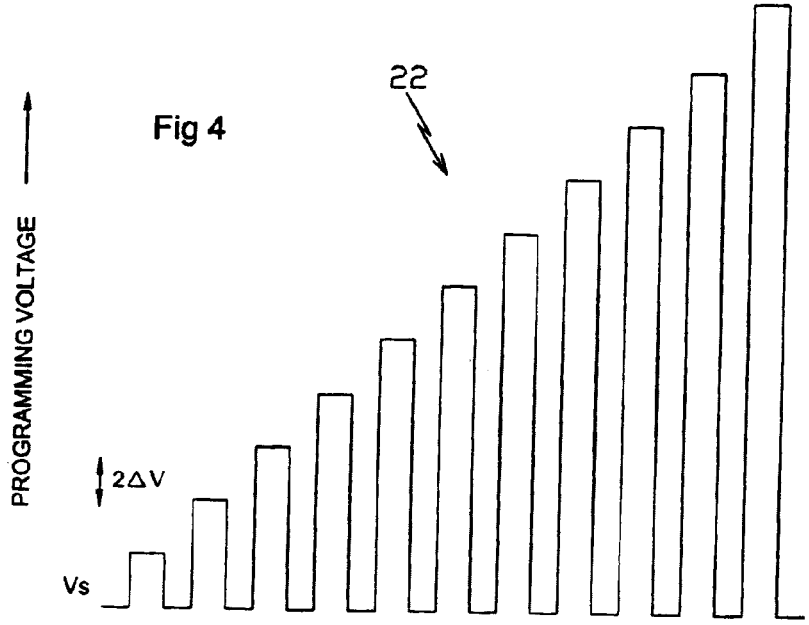
Figure 6:
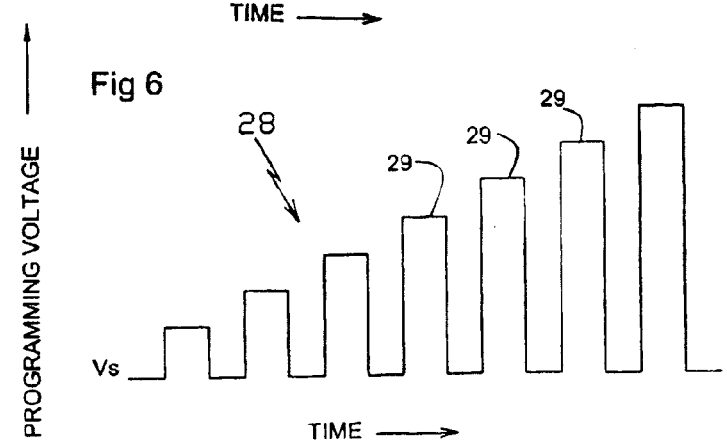

FIG. 9 is a partial high-level block diagram of a system 70 of the present invention. System 70 includes a memory 72 (specifically a flash memory) controlled by a controller 74, a processor 76 and standard input-output devices such as a keyboard, a mouse and a video display, represented collectively by an I/O block 78. Memory 72, processor 74 and I/O block 78 communicate via a common bus 80. Processor 74 runs applications by executing the code of the applications; this executable code typically also is stored in memory 72. These applications generate data that are to be archived in memory 72. Some of these applications generate, along with the data, flags that are interpreted by controller 74 as indications as to whether the data are to be archived as short-term archival data or long-term archival data using one of the methods described above. For example, a Web browser would flag pages to be "cached" as short-term archival data. The executable application code generally is stored by the compiler that generates the code as long-term archival data. Some applications give a user the option, via I/O devices 78, to select long-term archiving or short-term archiving for the data generated by these applications. The user then indicates, via I/O devices 78, whether the data are to be archived as short-term archival data or long-term archival data. For example, a user of a digital camera may wish to archive some pictures "permanently" while saving other pictures only "temporarily".

While the invention has been described with respect to a limited number of embodiments, it will be appreciated that many variations, modifications and other applications of the invention may be made.

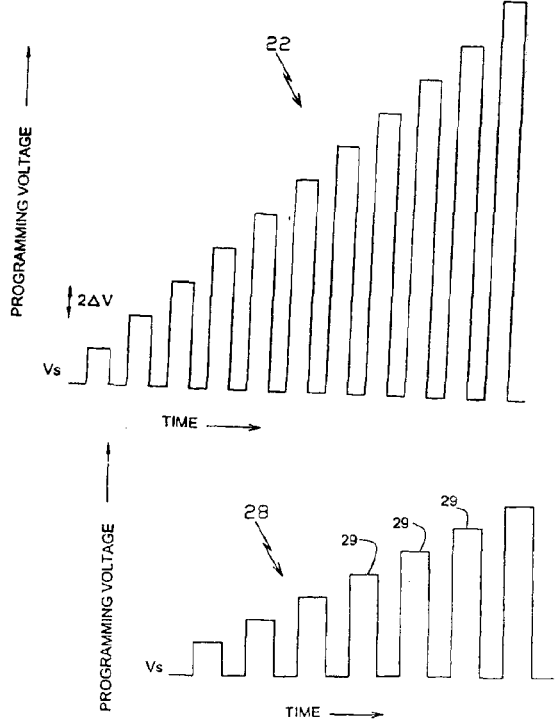

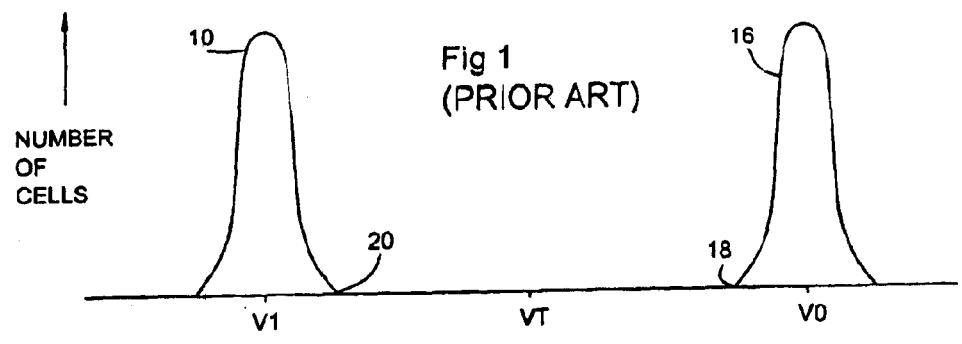
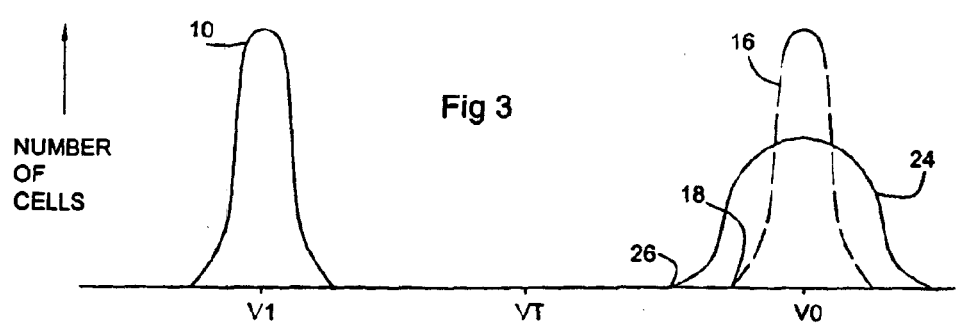
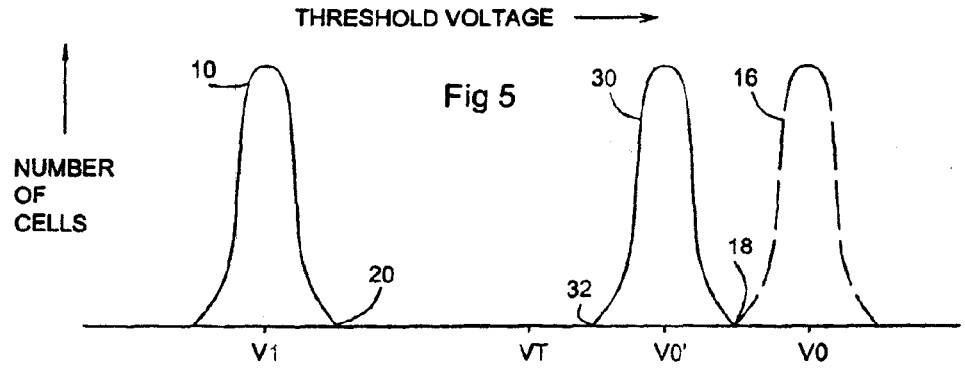
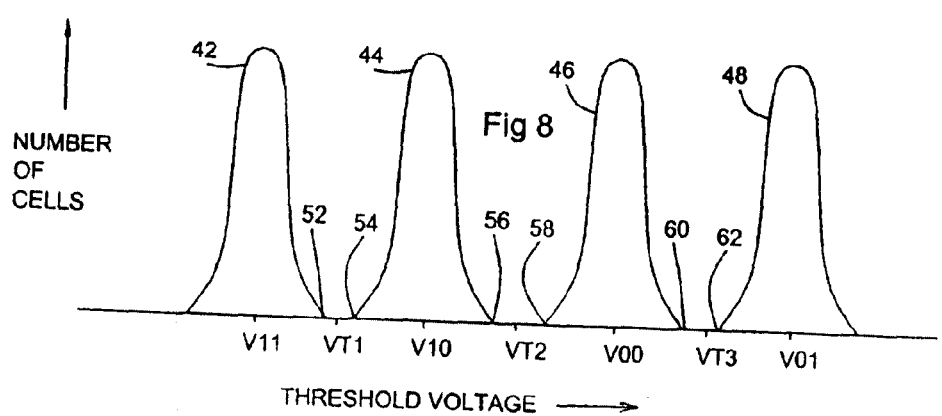

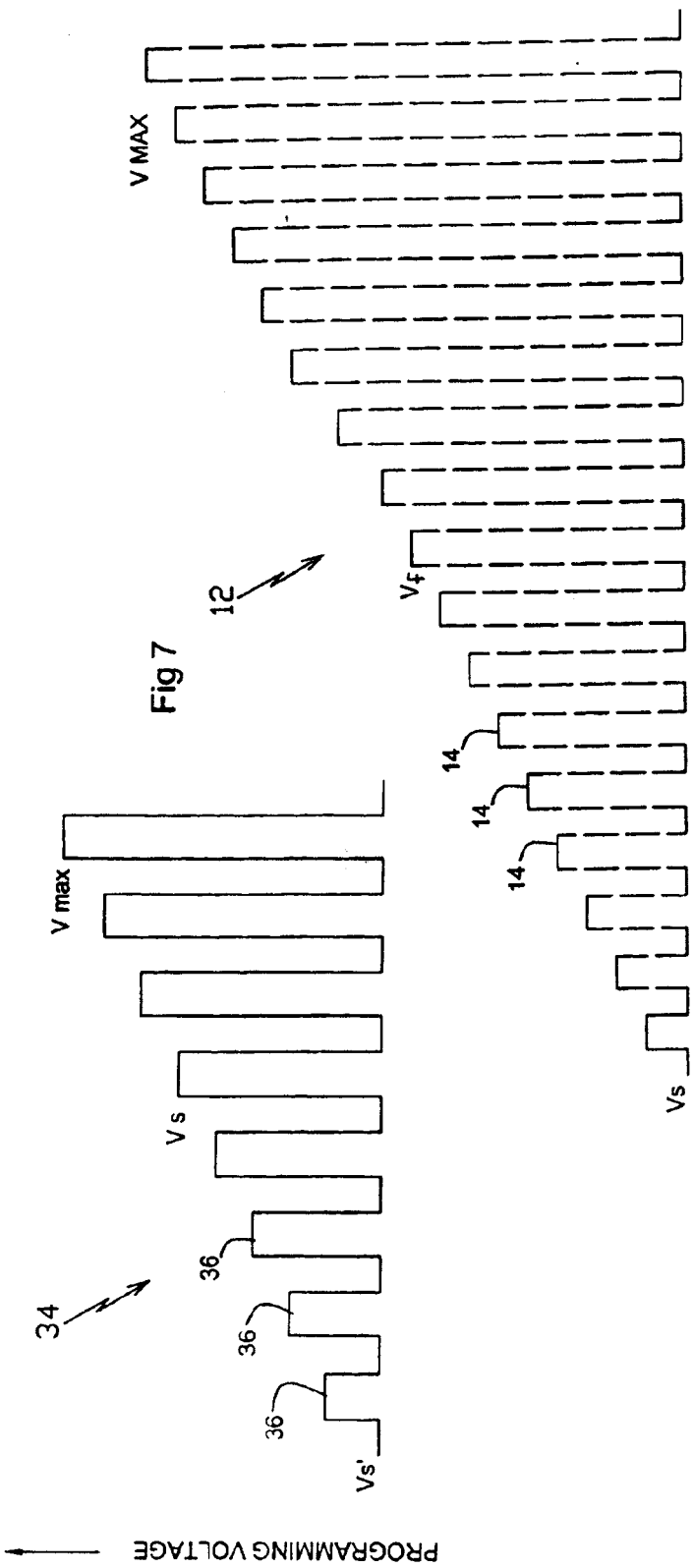

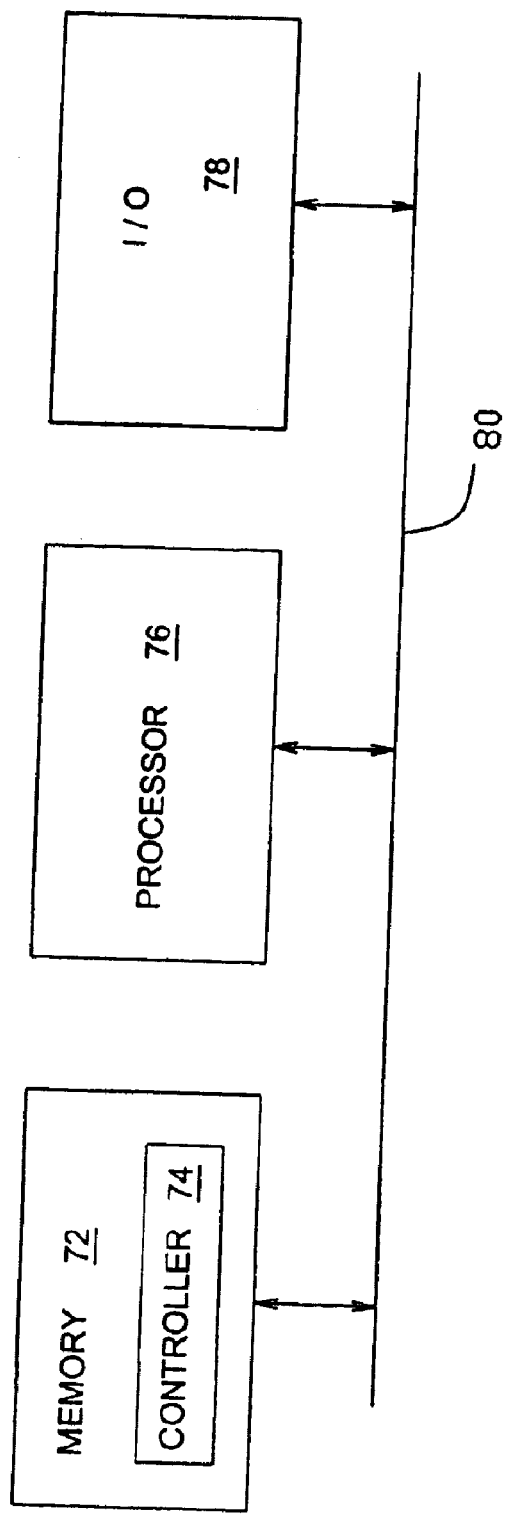

What is claimed is:

1. A method of archiving data in a memory, comprising the steps of:
   (a) classifying the data according to a desired lifetime thereof; and
   (b) archiving the data in the memory using a storage method having a reliability in accordance with said desired lifetime.

2. The method of claim 1, wherein said storage method includes a parameter, a value whereof is set in accordance with said classifying to control said reliability.

3. A system for archiving data, comprising:
   (a) a mechanism for classifying the data according to a desired lifetime thereof; and
   (b) a memory having a controller operative to archive the data in said memory using a storage method having a reliability in accordance with said desired lifetime.

4. The system of claim 3, said mechanism includes a processor for running an application that produces and classifies the data.

5. The system of claim 3, wherein said mechanism includes an input device wherewith a user classifies the data.

6. The system of claim 3, wherein said memory is a non-volatile memory.

7. The system of claim 3, wherein said storage method includes a parameter, a value whereof is set in accordance with said classifying to control said reliability.

8. The system of claim 7, wherein said memory is an EPROM including a plurality of cells.

9. A method of archiving data in a memory, comprising the steps of:
   (a) classifying the data according to a desired lifetime thereof; and
   (b) archiving the data in the memory using a storage method having a reliability in accordance with said desired lifetime, wherein said storage method includes a parameter, a value whereof is set in accordance with said classifying to control said reliability, and wherein said parameter is selected from the group consisting of a programming voltage pulse increment, a target threshold voltage, a programming voltage pulse width, a starting programming voltage, a maximum number of programming voltage pulses, a maximum programming voltage and a number of levels per cell of the memory.

10. A system for archiving data, comprising:
    (a) a mechanism for classifying the data according to a desired lifetime thereof; and
    (b) an EPROM including a plurality of cells and having a controller operative to archive the data in said EPROM using a storage method having a reliability in accordance with said desired lifetime, wherein said storage method includes a parameter, a value whereof is set in accordance with said classifying to control said reliability, and wherein said parameter is selected from the group consisting of an increment of a voltage pulse used to program said cells, a target threshold voltage of said cells, a width of programming voltage pulses used to program said cells, a starting voltage used to program said cells, a maximum number of programming voltage pulses used to program said cells, a maximum voltage used to program said cells and a number of programming levels of said cells.

* * * * *

UNITED STATES PATENT AND TRADEMARK OFFICE
CERTIFICATE OF CORRECTION

PATENT NO. : 6,903,972 B2
DATED : June 7, 2005
INVENTOR(S) : Lasser et al.

It is certified that error appears in the above-identified patent and that said Letters Patent is hereby corrected as shown below:

The title page, showing illustrative figures, should be deleted and substitute therefore the attached title page.

Delete drawing sheets 1-4 and substitute therefore the drawing sheet consisting of FIGS. 1-9 as shown on the attached sheets.

Signed and Sealed this

First Day of November, 2005

JON W. DUDAS
*Director of the United States Patent and Trademark Office*

(12) United States Patent
Lasser et al.

(10) Patent No.: US 6,903,972 B2
(45) Date of Patent: Jun. 7, 2005

(54) DIFFERENT METHODS APPLIED FOR ARCHIVING DATA ACCORDING TO THEIR DESIRED LIFETIME

(75) Inventors: Menahem Lasser, Kohav Yair (IL); Amir Ronen, Hod Hasharon (IL)

(73) Assignee: M-Systems Flash Disk Pioneers Ltd., Kfar Saba (IL)

( * ) Notice: Subject to any disclaimer, the term of this patent is extended or adjusted under 35 U.S.C. 154(b) by 0 days.

(21) Appl. No.: 10/735,667

(22) Filed: Dec. 16, 2003

(65) Prior Publication Data

US 2005/0024941 A1 Feb. 3, 2005

Related U.S. Application Data

(60) Provisional application No. 60/492,206, filed on Jul. 30, 2003.

(51) Int. Cl.⁷ .............................................. G11C 16/04
(52) U.S. Cl. ........................... 365/185.18; 365/185.19; 365/185.24; 711/136; 711/156; 711/160
(58) Field of Search ................................. 711/136, 156, 711/160; 365/185.18, 185.19, 185.24

(56) References Cited

U.S. PATENT DOCUMENTS

| | | | |
|---|---|---|---|
| 5,930,167 A | 7/1999 | Lee et al. | |
| 6,070,228 A * | 5/2000 | Belknap et al. | 711/118 |
| 6,212,568 B1 * | 4/2001 | Miller et al. | 709/236 |
| 6,456,528 B1 | 9/2002 | Chen | |
| 6,542,966 B1 * | 4/2003 | Crawford et al. | 711/133 |
| 2002/0092030 A1 * | 7/2002 | Gu | 725/134 |

* cited by examiner

Primary Examiner—Van Thu Nguyen
(74) Attorney, Agent, or Firm—Mark M. Friedman

(57) ABSTRACT

A method and system for archiving data. The data are classified according to their desired lifetime and then archived in a memory using a storage method whose reliability is in accordance with the desired lifetime. For example, when storing data in the cells of an EPROM, short-term data could be archived using larger programming voltage pulse increments than for long-term data, using a lower target threshold voltage than for long-term data, using wider programming voltage pulses than for long-term data, using higher starting programming voltages than for long-term data, using fewer programming voltage pulses than for long term data, using lower maximum programming voltages than for long term data, or using more levels per cell than for long-term data.

10 Claims, 4 Drawing Sheets